(12) United States Patent
Chang et al.

(10) Patent No.: US 6,858,353 B2
(45) Date of Patent: Feb. 22, 2005

(54) INCREASED-CONTRAST FILM FOR HIGH-TRANSMITTANCE ATTENUATED PHASE-SHAFT MASKS

(75) Inventors: Chia-Yang Chang, Hsin-Chu (TW); Tyng-Hao Hsu, Hsin-Chu (TW); Chang-Cheng Hung, Hsin-Chu (TW); Chin-Hsiang Lin, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 168 days.

(21) Appl. No.: 10/196,974
(22) Filed: Jul. 17, 2002
(65) Prior Publication Data
US 2004/0013947 A1 Jan. 22, 2004

(51) Int. Cl.[7] .................................... G03F 9/00
(52) U.S. Cl. ........................................................ 430/5
(58) Field of Search ........................ 430/5, 30; 382/144

(56) References Cited

U.S. PATENT DOCUMENTS 6,641,959 B2 * 11/2003 Yan ............................. 430/5

* cited by examiner

Primary Examiner—Saleha R. Mohamedulla
(74) Attorney, Agent, or Firm—Tung & Associates

(57) ABSTRACT

An increased-contrast film for high-transmittance attenuated phase-shift masks (PSM's) is disclosed. A high-transmittance attenuated PSM includes a clear substrate, a shifter film selectively covering the clear substrate, and an increased-contrast film covering the shifter film to aid inspection of the PSM. The increased-contrast film may be removable, and may be photoresist. The increased-contrast film is preferably non-reactive to light used during the inspection of the PSM.

13 Claims, 4 Drawing Sheets

INCREASED-CONTRAST FILM FOR HIGH-TRANSMITTANCE ATTENUATED PHASE-SHAFT MASKS

FIELD OF THE INVENTION

This invention relates generally to phase-shift masks (PSM's), and more particularly to high-transmittance, attenuated PSM's.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in optical photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on optical lithographic processes. Resolution of anything smaller than a wavelength is generally quite difficult. Pattern fidelity can deteriorate dramatically in sub-wavelength lithography. Another difficulty with sub-wavelength photolithography is that, as two mask patterns get closer together, diffraction problems occur. At some point, the normal diffraction of the exposure rays start touching, leaving the patterns unresolved in the resist. The blending of the two diffraction patterns into one results from all the rays being in the same phase. Phase is a term that relates to the relative positions of a wave's peaks and valleys. One way to prevent the diffraction patterns from affecting two adjacent mask patterns is to cover one of the openings with a transparent layer that shifts one of the sets of exposing rays out of phase, which in turn nulls the blending.

This is accomplished by using a special type of photomask known as a phase shift mask (PSM). A typical photomask, referred to as a binary mask, affects only one of the properties of light, the intensity. Where there is chromium, which is an opaque region, an intensity of zero percent results, whereas where the chromium has been removed, such that there is a clear or transparent region, an intensity of substantially 100 percent results. By comparison, a PSM not only changes the intensity of the light passing through, but its phase as well. By changing the phase of the light by 180 degrees in some areas, the PSM takes advantage of how the original light wave adds to the 180 degree wave to produce zero intensity as a result of destructive interference.

Types of PSM's include alternating PSM's and attenuated PSM's. The latter is of interest here, and is also referred to as a half-tone PSM. Unlike a binary photomask, an attenuated PSM has a dark region, referred to as the shifter region, or shifter film, that allows some light to transmit through. By comparison, the dark region of a binary photomask allows no light to transmit through. A typical attenuated PSM may have a shifter film that only allows less than ten percent of the light to pass through, such as only three-to-eight percent of the light to pass through. By comparison, a high-transmittance attenuated PSM may have a shifter film that allows a greater percentage of the light to transmit, such as ten-to-twenty-five percent, or more, such as forty-five percent.

FIGS. 1A and 1B show the comparison between a standard binary photomask and an attenuated PSM. The standard binary photomask 100 of FIG. 1A has a clear region 102, such as quartz, and an opaque region 104, such as chromium. When the photomask 100 is subjected to the light 106, the opaque region 104 blocks the light, so the only light that passes through the photomask 100 is that which the opaque region 104 does not block. By comparison, the attenuated PSM 120 of FIG. 1B also has a clear region 108, such as quartz, and a semi-opaque or semi-dark region 110, the latter which is a shifter film. The shifter film may be molybdenum silicide ($MoSiOxNy$, or Mo—Si), chromium fluoride (CrF), or zirconium-type materials, such as ZrSiO. When the attenuated PSM 120 is subjected to the light 112, the semi-opaque region 110 only blocks a portion of the light. Thus, the light completely passes through the clear region 108, and only anywhere from three percent or more—but less than one-hundred percent of—the light passes through the semi-opaque region 110.

A problem with high-transmittance attenuated PSM's, however, is that they are difficult to inspect for defects. This is because most inspection tools rely on light, where an operator examines the semi-opaque regions as compared to the clear regions to ensure that the regions have been accurately created. However, since both the semi-opaque regions and the clear regions of attenuated PSM's transmit light, and since the semi-opaque regions of high-transmittance attenuated PSM's may transmit as much as forty-five percent or more of the light, it is difficult for the operator to distinguish the semi-opaque regions from the clear regions. That is, there is low contrast between the semi-opaque regions and the clear regions of high-transmittance attenuated PSM's. A limited solution is to decrease the sensitivity of the inspection tools, to increase contrast. However, this means that critical defects of such high-transmittance attenuated PSM's may escape detection by the operator, leading to improperly fabricated semiconductor devices, and thus to wafer scrap.

Therefore, there is a need to overcome these disadvantages associated with inspection of high-transmittance attenuated PSM's. Specifically, there is a need for inspecting high-transmittance attenuated PSM's in a way that overcomes the inherent low contrast between the semi-opaque regions and the clear regions of such PSM's. Such inspection should be able to be performed without having to decrease the sensitivity of the inspection tools, so that critical defects do not escape detection. For these and other reasons, there is a need for the present invention.

SUMMARY OF THE INVENTION

The invention relates to an increased-contrast film for high-transmittance attenuated phase-shift masks (PSM's). A high-transmittance attenuated PSM includes a clear substrate, a shifter film selectively covering the clear substrate, and an increased-contrast film covering the shifter film to aid inspection of the PSM. The increased-contrast film may be removable, and may be photoresist. The increased-contrast film is preferably non-reactive to light used during the inspection of the PSM.

Embodiments of the invention provide for advantages over the prior art. The addition of the increased-contrast film means that typical inspection tools can clearly distinguish the shifter film from the clear substrate, since the former is now covered with an increased-contrast film. Thus, the sensitivity of the inspection tools does not have to be decreased, increasing the potential for all critical defects that may be present in the PSM to be found, which can reduce wafer scrap.

Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1A:
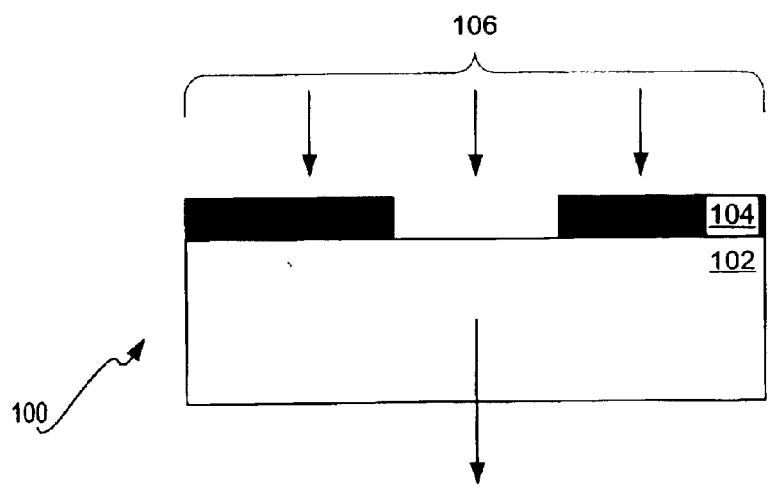
FIG. 1A is a diagram showing a typical binary photomask, having a dark region that transmits substantially no light, and a transparent region that transmits substantially all light.
Figure 1B:
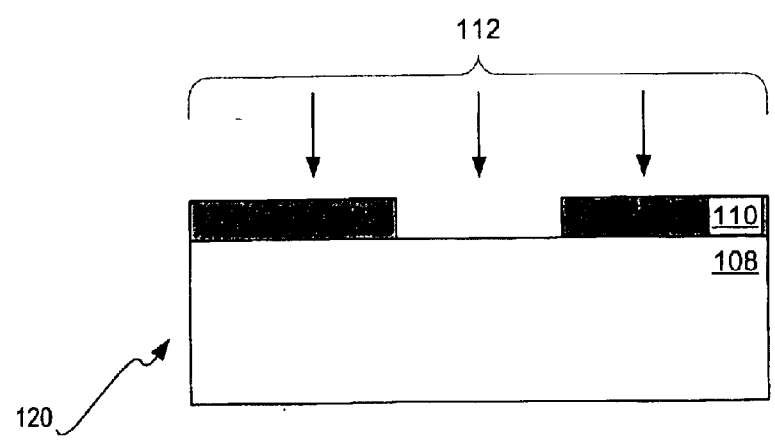
FIG. 1B is a diagram showing a typical attenuated phase-shift mask (PSM), having a half-tone region that transmits some light, and a transparent region that transmits substantially all light.
Figure 2:
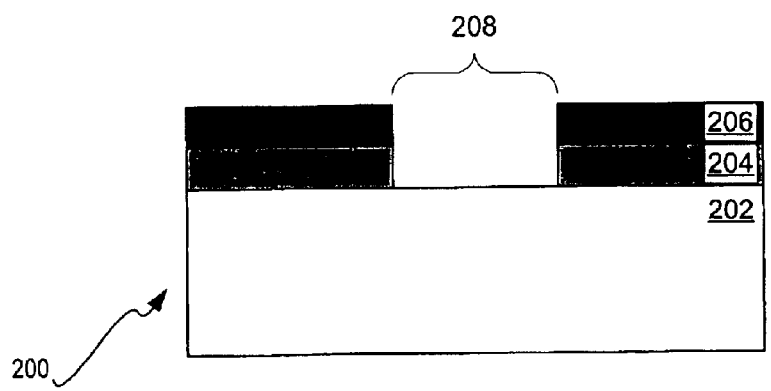
FIG. 2 is a diagram of a high-transmittance attenuated PSM having an increased contrast film covering its shifter film, according to an embodiment of the invention. The presence of the increased contrast film increases the contrast of the shifter film, aiding inspection of the PSM with an inspection tool that uses light.

FIG. 2 shows a high-transmittance attenuated phase-shift mask (PSM) 200 according to an embodiment of the invention. The PSM 200 includes an at least substantially clear substrate 202, a shifter film 204 selectively covering the clear substrate 202, and a removable increased-contrast film 206 substantially covering all of the shifter film 204. The PSM 200 is an attenuated PSM in that the shifter film 204 transmits less than all, but more than none, of light to which the PSM 200 is subjected. The PSM 200 is a high-transmittance PSM in that the shifter film 204 transmits a high amount of light as compared to non-high-transmittance PSM's. This may and can mean that the shifter film 204 transmits more than eight percent, but less than one-hundred percent, of light to which the PSM 200 is subjected. In one embodiment, the shifter film 204 transmits substantially forty-five percent of 365 nanometer (nm)-wavelength light to which the PSM 200 is subjected. By comparison, the clear substrate 202 transmits substantially all of the light to which the PSM 200 is subjected.

The clear substrate 202 can be quartz, whereas the shifter film 204 can be molybdenum silicide, chromium fluoride, a zirconium-type material, or another type of material. The shifter film 204 is said to selectively cover the clear substrate 202 in that in some places, such as the area 208, the shifter film 204 can or may not cover the clear substrate 202. The removable increased-contrast film 206 provides for increased contrast vis-à-vis the clear substrate 202. That is, without the increased-contrast film 206, it can be difficult to distinguish the clear substrate 202 from the shifter film 204 using an inspection tool that utilizes light, because the shifter film 204 highly transmits the light. By comparison, the increased-contrast film 206 does not as substantially transmit such light, and thus aids the inspection of the PSM 200. Preferably, the increased-contrast film 206 is a high-contrast film, and is removable, so that after inspection of the PSM 200 the film 206 can be removed. The increased-contrast film 206 can be photoresist, preferably that which is non-reactive to the light used during inspection.

Figure 3:
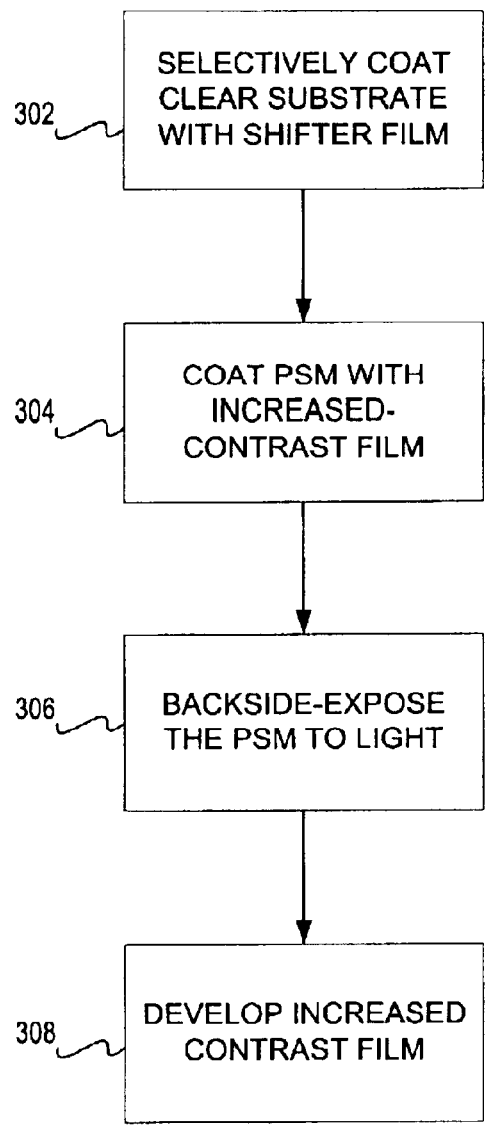
FIG. 3 is a flowchart of a method for fabricating a high-transmittance attenuated PSM having an increased contrast film covering its shifter film, according to an embodiment of the invention. The method of FIG. 3 may be used to fabricate the PSM of FIG. 2, for instance.
Figure 3:
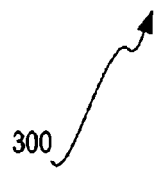
Figure 4A:
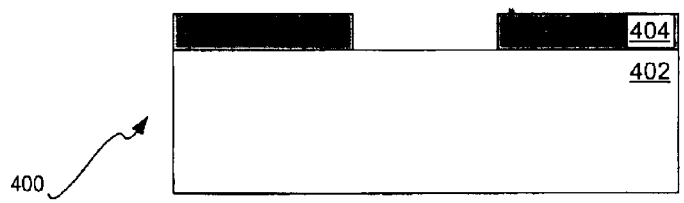
FIGS. 4A–4D are diagrams showing illustratively the fabrication of a high-transmittance attenuated PSM according to the method of FIG. 3, according to an embodiment of the invention.
Figure 4B:
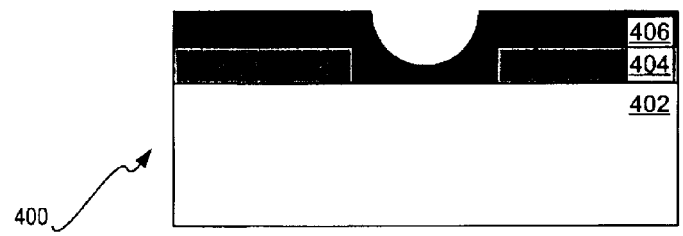

FIG. 3 shows a method 300 for fabricating a high-transmittance attenuated PSM, such as the PSM 200 of FIG. 2, according to an embodiment of the invention. First, a clear substrate is selectively coated with a shifter film (302). This is shown in FIG. 4A, in which the shifter film 404 selectively covers the clear substrate 402 of the PSM 400. The shifter film has a high transmittance, so that the PSM 400 is a high-transmittance attenuated PSM. Referring back to FIG. 3, the PSM is next coated with an increased-contrast film (304). This is shown in FIG. 4B, in which the PSM 400 has been entirely coated with the photoresist 406, which is one type of increased-contrast film.

Figure 4C:
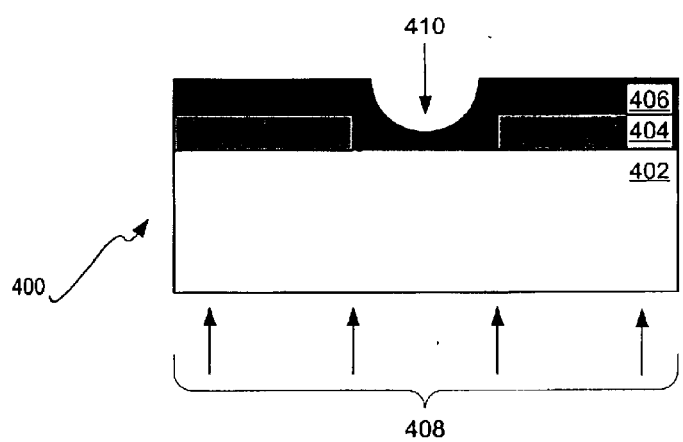
Figure 4D:
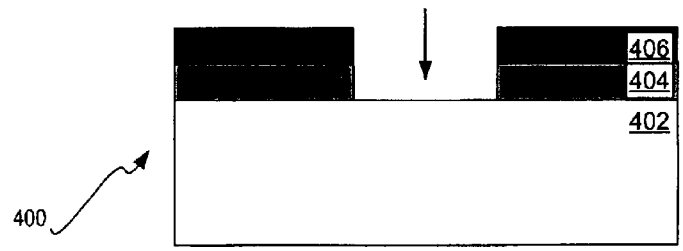

Referring back to FIG. 3, the PSM is backside-exposed to light to which the increased-contrast film is sensitive, but which the shifter film substantially blocks or does not transmit (306). This is shown in FIG. 4C, in which the backside of the PSM 400, through the clear substrate 402, is exposed to the light 408. The shifter film 404 thus acts as a mask to the photoresist 406, so that the only part of the photoresist 406 exposed to the light is that part indicated by the arrow 410. Referring back to FIG. 3, the increased-contrast film of the PSM is finally developed so that substantially only the increased-contrast film of the PSM that remains is that which covers the shifter film (308). This is shown in FIG. 4D. Because only the photoresist 406 that had been indicated by the arrow 410 was actually exposed to the light 408, only this part of the photoresist 406 is removed during development.

Figure 5:
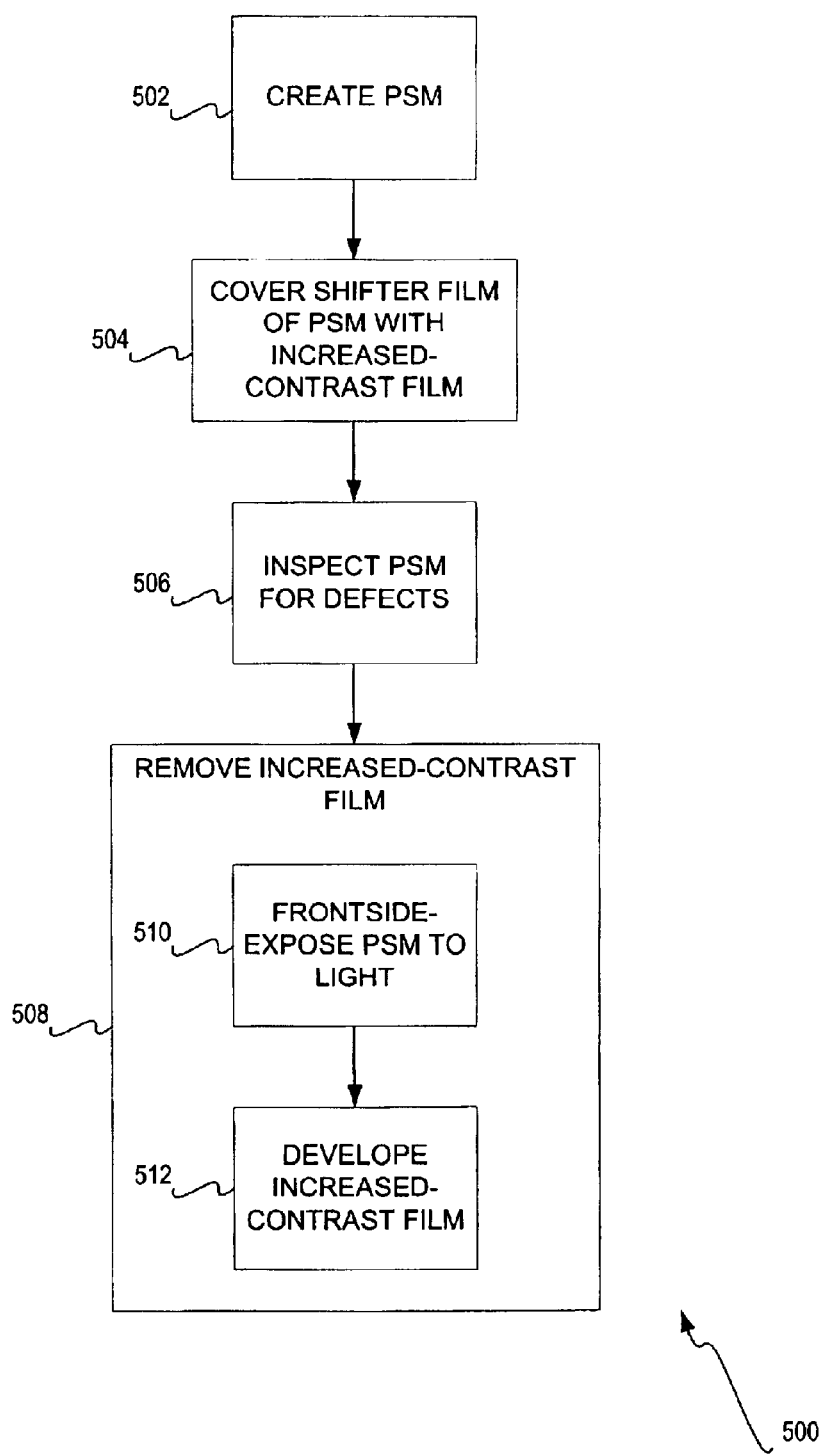
FIG. 5 is a flowchart of a method according to an embodiment of the invention that includes inspecting a high-transmittance attenuated PSM that has an increased contrast film covering its shifter film.

FIG. 5 shows another method 500 according to an embodiment of the invention. First, a high-transmittance attenuated PSM is created (502). The PSM has a clear substrate selectively covered by a shifter film. Next, the shifter film of the PSM is covered with an increased-contrast film (504). This can be accomplished by performing at least parts of the method 300 of FIG. 3, and can result in the PSM 200 of FIG. 2. The PSM can then be inspected for defects (506), by using an inspection tool utilizing light that the increased-contrast film does not substantially transmit. Once the PSM has passed inspection, the increased-contrast film can finally be removed (508). This may be accomplished by frontside-exposing the PSM to light to which the increased-contrast film is sensitive (510), and then developing the increased-contrast film to remove it (512). The light exposure and development process of 510 and 512 can be the same process performed in 306 and 308 of FIG. 3, except that the frontside of the PSM is exposed to the light in 510 and 512, not the backside of the PSM as in 306 and 308.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A high-transmittance attenuated phase-shift mask (PSM) comprising:
    a clear substrate;
    a shifter film selectively covering the clear substrate; and,
    an increased-contrast film covering the shifter film to increase contrast of the shifter film relative to the clear substrate to aid inspection of the PSM.

2. The PSM of claim 1, wherein the clear substrate is quartz and the shifter film is one of: molybdenum silicide, chromium fluoride, and a zirconium-type material.

3. The PSM of claim 1, wherein the increased-contrast film is removable.

4. The PSM of claim 1, wherein the shifter film has a transmittance of greater than eight percent and less than one-hundred percent.

5. The PSM of claim 1, wherein the shifter film has a transmittance of substantially forty-five percent.

6. The PSM of claim 1, wherein the increased-contrast film is photoresist.

7. The PSM of claim 1, wherein the increased-contrast film is non-reactive to light used during the inspection.

8. A method for creating a high-transmittance attenuated phase-shift mask (PSM) comprising:
    selectively covering a clear substrate of the PSM with a shifter film;
    coating the PSM with an increased-contrast film that increases contrast of the shifter film with respect to the clear substrate of the PSM;
    backside-exposing the PSM to light to which the increased-contrast film is sensitive and that the shifter film substantially does not transmit; and,
    developing the increased-contrast film so that substantially only the increased-contrast film covering the shifter film remains.

9. The method of claim 8, wherein the clear substrate is quartz, and the shifter film is one of: molybdenum silicide, chromium fluoride, and a zirconium-type material.

10. The method of claim 8, wherein the shifter film has a transmittance of greater than eight percent and less than one-hundred percent.

11. The method of claim 8, wherein the shifter film has a transmittance of substantially forty-five percent.

12. The method of claim 8, wherein the increased-contrast film is photoresist.

13. The method of claim 8, wherein the increased-contrast film is non-reactive to light used during inspection of the PSM.

* * * * *